United States Patent
Nagano et al.

(10) Patent No.: US 12,534,396 B2
(45) Date of Patent: *Jan. 27, 2026

(54) SUPPORTING GLASS SUBSTRATE

(71) Applicant: AGC Inc., Tokyo (JP)

(72) Inventors: Mikio Nagano, Tokyo (JP); Seiji Inaba, Tokyo (JP); Yasunari Saito, Tokyo (JP); Kiyoshi Tamai, Tokyo (JP); Kazutaka Ono, Tokyo (JP); Yuha Kobayashi, Tokyo (JP)

(73) Assignee: AGC Inc., Tokyo (JP)

( * ) Notice: Subject to any disclaimer, the term of this patent is extended or adjusted under 35 U.S.C. 154(b) by 589 days.

This patent is subject to a terminal disclaimer.

(21) Appl. No.: 17/585,787

(22) Filed: Jan. 27, 2022

(65) Prior Publication Data

US 2022/0144685 A1    May 12, 2022

Related U.S. Application Data

(63) Continuation of application No. PCT/JP2020/022363, filed on Jun. 5, 2020.

(51) Int. Cl.
*C03C 3/097* (2006.01)
*C03C 3/085* (2006.01)
(Continued)

(52) U.S. Cl.
CPC .............. *C03C 3/087* (2013.01); *C03C 3/085* (2013.01); *C03C 3/091* (2013.01); *C03C 3/095* (2013.01);
(Continued)

(58) Field of Classification Search
CPC .......... C03C 3/097; C03C 3/087; C03C 3/091
(Continued)

(56) References Cited

U.S. PATENT DOCUMENTS 5,145,540 A * 9/1992 Foley .................. H01L 21/4807
428/209
5,981,015 A   11/1999 Zou et al.
(Continued)

FOREIGN PATENT DOCUMENTS

CN    107207323 A    9/2017
CN    109923083 A    6/2019
(Continued)

OTHER PUBLICATIONS

Machine_English_translation_JP_2016113341_A; Suzuki, R.; Support glass Substrate and Laminate Using the Same; Jun. 23, 2016; EPO; whole document (Year: 2023).*
(Continued)

*Primary Examiner* — Tahseen Khan
(74) *Attorney, Agent, or Firm* — Oblon, McClelland, Maier & Neustadt, L.L.P.

(57) ABSTRACT

Suppressing deflection and reducing weight are to be achieved. A supporting glass substrate has a ratio of a Young's modulus (GPa) to a density (g/cm³) that is 37.0 (GPa·cm³/g) or more and the ratio has a value larger than a ratio calculation value, the ratio calculation value being a ratio of a Young's modulus (GPa) calculated from a composition to a density (g/cm³). The ratio calculation value is represented by the following expression: $\alpha = 2 \cdot \Sigma\{(V_i \cdot G_i)/M_i \cdot X_i\}$, where, in the expression, $V_i$ is a filling parameter of a metal oxide contained in the supporting glass substrate, $G_i$ is a dissociation energy of a metal oxide contained in the supporting glass substrate, $M_i$ is a molecular weight of a metal oxide contained in the supporting glass substrate, and $X_i$ is a molar ratio of a metal oxide contained in the supporting glass substrate.

20 Claims, 3 Drawing Sheets

(51) Int. Cl.
  *C03C 3/087* (2006.01)
  *C03C 3/091* (2006.01)
  *C03C 3/095* (2006.01)
  *H01L 21/683* (2006.01)
  *H01L 23/15* (2006.01)
(52) U.S. Cl.
  CPC .......... *C03C 3/097* (2013.01); *H01L 21/6835* (2013.01); *H01L 23/15* (2013.01)
(58) Field of Classification Search
  USPC ....................................................... 428/220
  See application file for complete search history.

(56) References Cited

U.S. PATENT DOCUMENTS

| | | | |
|---|---|---|---|
| 2012/0212794 | A1 | 8/2012 | Giron et al. |
| 2014/0179510 | A1* | 6/2014 | Allan .................... C03C 3/093 501/67 |
| 2017/0327408 | A1 | 11/2017 | Nomura et al. |
| 2018/0082914 | A1 | 3/2018 | Hanawa et al. |
| 2018/0151408 | A1 | 5/2018 | Hanawa et al. |
| 2019/0161388 | A1 | 5/2019 | Nomura et al. |
| 2019/0362754 | A1 | 11/2019 | Sato et al. |
| 2019/0385920 | A1 | 12/2019 | Hanawa et al. |
| 2021/0032155 | A1 | 2/2021 | Inaba et al. |

FOREIGN PATENT DOCUMENTS

| | | |
|---|---|---|
| JP | 03-150236 A | 6/1991 |
| JP | 10-079122 A | 3/1998 |
| JP | 2000-063144 A | 2/2000 |
| JP | 2002-358626 A | 12/2002 |
| JP | 2012-533776 A | 12/2012 |
| JP | 2016113341 A * | 6/2016 |
| JP | WO 2016/190303 A1 | 12/2016 |
| JP | 6443668 B2 | 12/2018 |
| TW | I746068 B | 11/2021 |
| WO | WO 2016/125787 A1 | 8/2016 |
| WO | WO 2017/018275 A1 | 2/2017 |
| WO | WO 2018/025727 A1 | 2/2018 |
| WO | WO 2018/088563 A1 | 5/2018 |
| WO | WO 2019/114499 A1 | 6/2019 |

OTHER PUBLICATIONS

International Search Report issued Aug. 18, 2020 in PCT/JP2020/022363 filed on Jun. 5, 2020, 2 pages.
Chaim et al., "Microstructure and Mechanical Properties of SiC Platelet/Cordierite Glass-Ceramic Composites", vol. 78, issue 1, Journal of the American Ceramic Society, 1995, pp. 166-172.
Singer et al., "Cordierite-based oxyfluoride glasses and glass ceramics. Part 1. Glasses", Physics and Chemistry of Glasses, vol. 30, No. 3, 1989, pp. 86-95.
Hayashi et al., "Densification of Compacted Magnesium Alumino-Silicate Glass Powders", Journal of the Ceramic Society of Japan, vol. 98, 1990, pp. 1070-1075.
International Search Report issued Sep. 10, 2019, in PCT/JP2019/029695 filed Jul. 29, 2019.

* cited by examiner

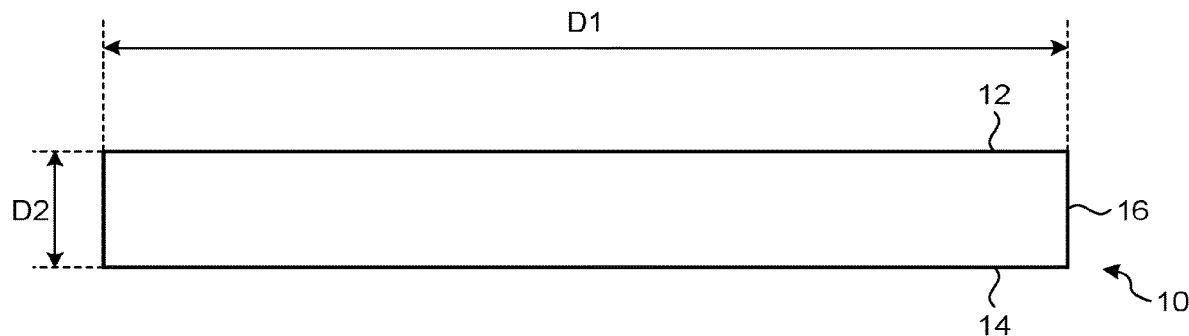
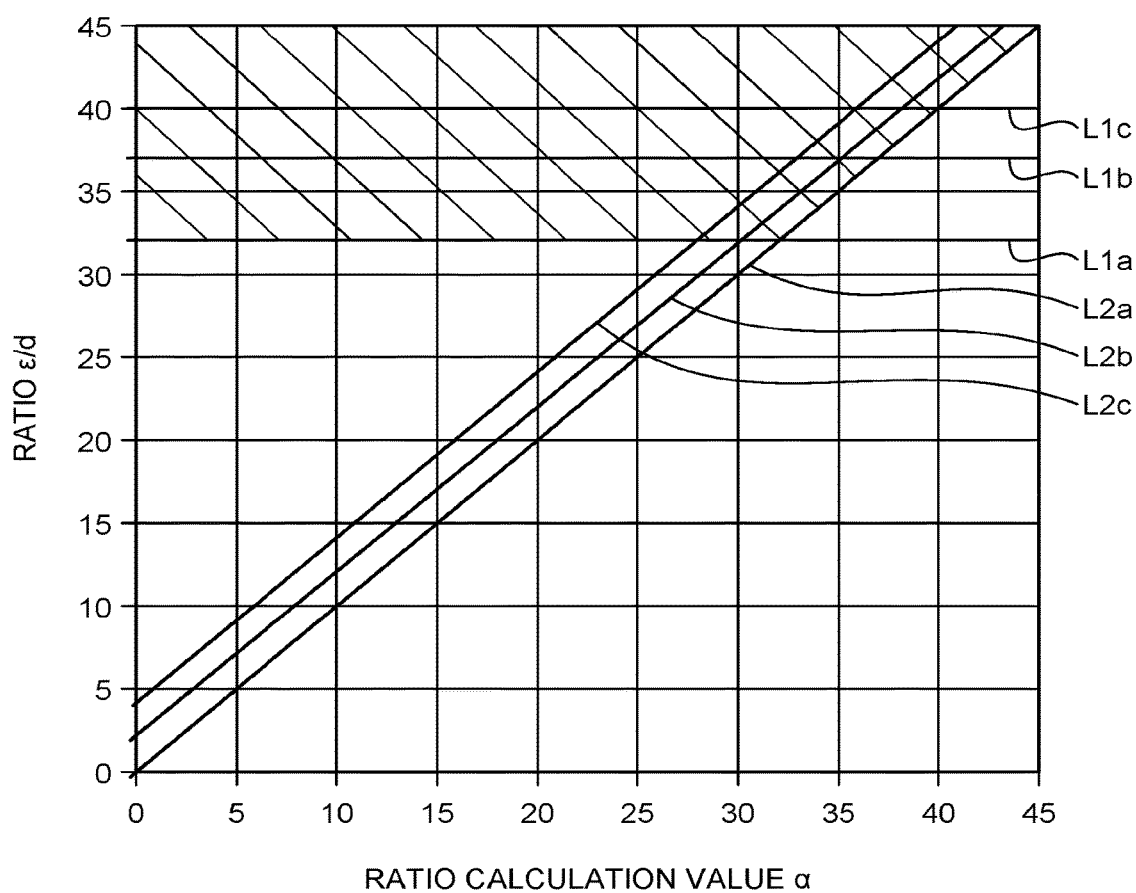

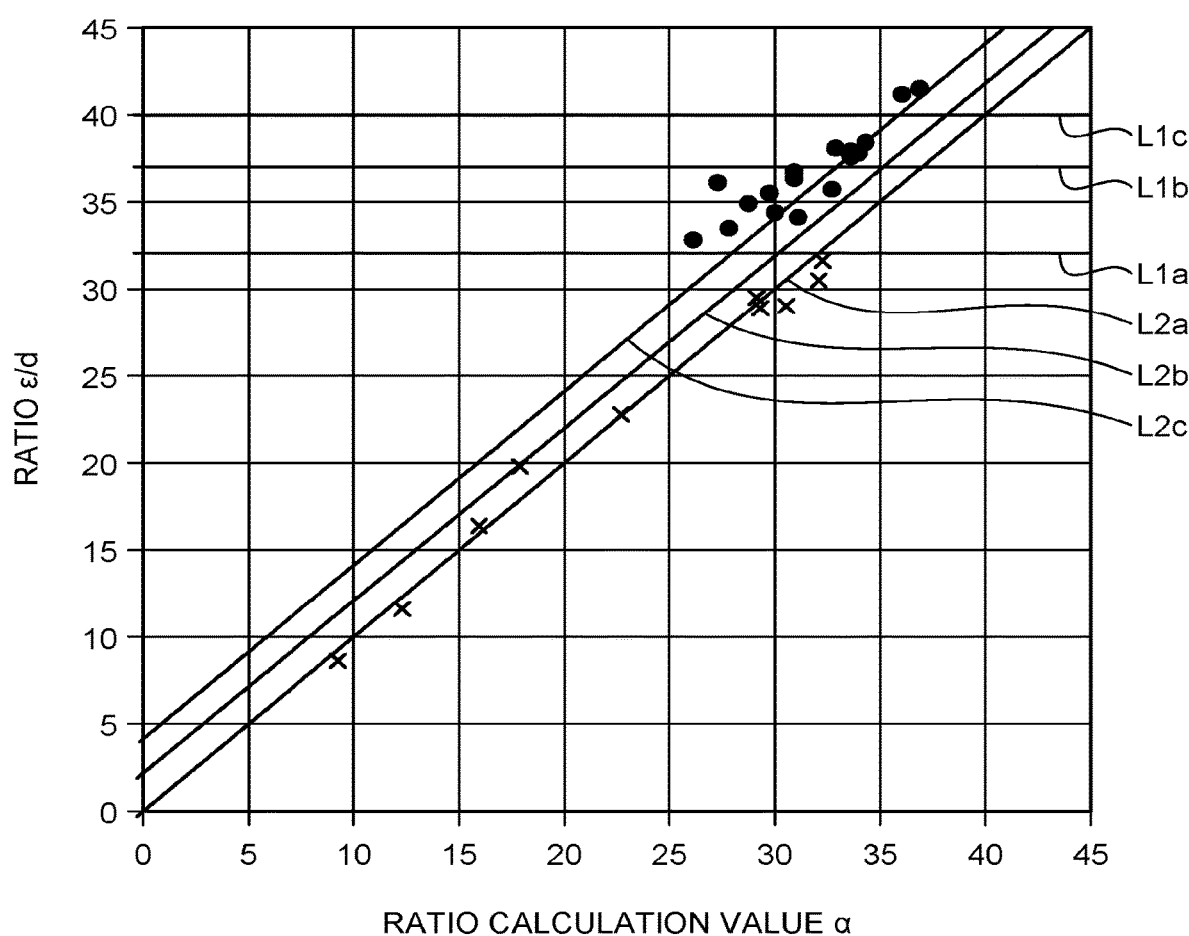

SUPPORTING GLASS SUBSTRATE

CROSS-REFERENCE TO RELATED APPLICATION(S)

This application claims priority from the prior PCT application No. PCT/JP2020/022363 filed on Jun. 5, 2020 PCT application No. PCT/JP2019/029695 filed on Jul. 29, 2019 and the prior Japanese Patent Application No. 2019-206867 filed on Nov. 15, 2019, the entire contents of which are incorporated herein by reference.

BACKGROUND OF THE INVENTION

1. Field of the Invention

The present invention relates to a supporting glass substrate.

2. Description of the Related Art

Along with the reduction in sizes of electronic devices, there is an increasing demand for techniques for mounting semiconductor devices used in these electronic devices at high density. In recent years, for example, a fan out wafer level package (FOWLP) and a fan out panel level package (FOPLP) have been proposed as the techniques for mounting semiconductor devices at high density. Hereinafter, the FOWLP and the FOPLP are collectively referred to as the FOWLP and the like.

In the FOWLP and the like, a supporting glass substrate that supports a processing substrate may be used in order to suppress a deflection of the processing substrate on which semiconductor devices are stacked (see, for example, Japanese Patent No. 6443668).

In a supporting glass substrate used for supporting members, such as the supporting glass substrate for the FOWLP and the like, a reduction in weight is also required in addition to suppression of the deflection. In the supporting glass substrate, in a case in which a thickness is increased in order to suppress the deflection, a mass is increased, and in a case in which a thickness is decreased in order to reduce the weight, the deflection tends to occur. Therefore, it may be difficult to achieve both suppressing deflection and reducing weight.

The present disclosure has been made in view of the above problem, and an object of the present invention is to provide a supporting glass substrate in which suppressing deflection and reducing weight can be achieved.

SUMMARY OF THE INVENTION

It is an object of the present invention to at least partially solve the problems in the conventional technology.

The supporting glass substrate of the present disclosure may have a ratio E/d (GPa·cm$^3$/g) of a Young's modulus ε (GPa) to a density d (g/cm$^3$) that is 37.0 (GPa·cm$^3$/g) or more and the ratio E/d (GPa·cm$^3$/g) has a value larger than a ratio calculation value α (GPa·cm$^3$/g), the ratio calculation value α (GPa·cm$^3$/g) being a ratio of a Young's modulus ε (GPa) to a density (g/cm$^3$) calculated from a composition. The ratio calculation value α (GPa·cm$^3$/g) is represented by the following expression:

$$\alpha = 2 \cdot \sum \{(V_i \cdot G_i / M_i) \cdot X_i\}$$

In the expression, $V_i$ is a filling parameter of a metal oxide contained in the supporting glass substrate, $G_i$ is a dissociation energy of a metal oxide contained in the supporting glass substrate, $M_i$ is a molecular weight of a metal oxide contained in the supporting glass substrate, and $X_i$ is a molar ratio of a metal oxide contained in the supporting glass substrate.

According to the present disclosure, suppressing deflection and reducing weight can be achieved.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 1 is a schematic view of a supporting glass substrate according to the present embodiment;

FIG. 2 is a graph for explaining performance of the supporting glass substrate according to the present embodiment;

FIG. 4 is a graph illustrating features of supporting glass substrates in Examples and Comparative Examples.

DETAILED DESCRIPTION OF THE PREFERRED EMBODIMENTS

Figure 3:
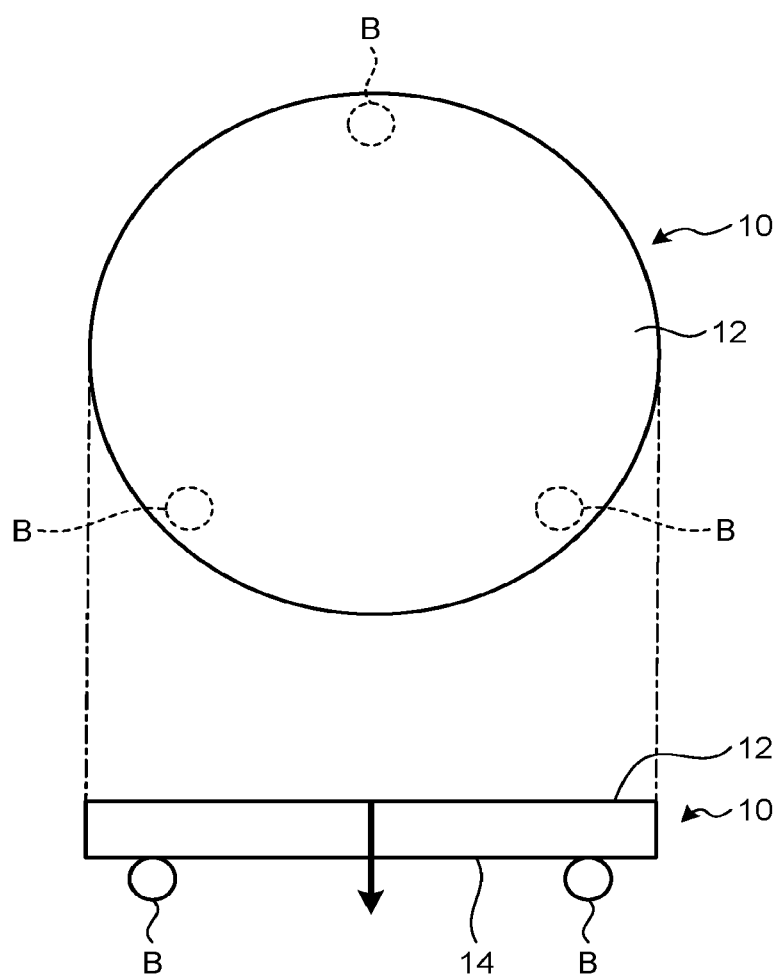
FIG. 3 is a schematic view illustrating a method of measuring deflection in Examples and Comparative Examples.

Hereinafter, a suitable embodiment of the present invention will be described in detail with reference to the accompanying drawings. The present invention is not limited to the embodiment, and in a case in which there are a plurality of embodiments, the present invention also includes configurations in which the respective embodiments are combined with each other.

FIG. 1 is a schematic view of a supporting glass substrate according to the present embodiment. As illustrated in FIG. 1, a supporting glass substrate 10 according to the present embodiment is used as a glass substrate for manufacturing a semiconductor package, and more specifically, a supporting glass substrate for manufacturing a FOWLP and the like. However, application of the supporting glass substrate 10 is not limited to manufacture of the FOWLP and the like and is optional, and the supporting glass substrate 10 may be used as a glass substrate used for supporting members. The FOWLP and the like include the above-described FOWLP and FOPLP.

In the supporting glass substrate 10, both suppressing deflection and reducing weight can be achieved by increasing a ratio E/d of a Young's modulus ε to a density d. Specifically, the supporting glass substrate 10 has a ratio E/d of 32.0 (GPa·cm$^3$/g) or more and satisfies following Expression (1). A ratio calculation value α in Expression (1) is a calculation value of a ratio of a Young's modulus to a density of the supporting glass substrate 10, which is calculated from a composition of the supporting glass substrate 10, and details will be described later.

$$\varepsilon/d > \alpha \quad (1)$$

The ratio E/d is a value calculated using a measurement value of the Young's modulus ε of the supporting glass substrate 10 and a measurement value of the density d of the supporting glass substrate 10.

In the present embodiment, the Young's modulus ε of the supporting glass substrate 10 is a value measured based on propagation of an ultrasonic wave with 38DL PLUS manufactured by Olympus Corporation. In addition, in the present embodiment, the density d of the supporting glass substrate 10 is a value measured by the Archimedes' method. The ratio E/d is calculated by dividing the actually measured Young's modulus ε by the actually measured density d. The unit of the Young's modulus ε is GPa, the unit of the density d is g/cm$^3$, and the unit of the ratio E/d is GPa·cm$^3$/g.

The ratio E/d is a value calculated using the measured values, whereas the ratio calculation value α is a value calculated from the composition of the supporting glass substrate 10 without using the measurement values of the Young's modulus ε and the density d. It is known that a Young's modulus of glass can be calculated from a composition thereof. Therefore, the ratio calculation value α of the Young's modulus to the density of the supporting glass substrate 10 can be calculated from the composition of the supporting glass substrate 10. The composition of the supporting glass substrate 10 herein means a composition in a case in which the composition contained in the supporting glass substrate 10 is converted into a metal oxide.

In more detail, the ratio calculation value α corresponds to a value obtained as follows: an ionic size of a metal oxide is multiplied by a binding strength between ions of the metal oxide to obtain a value; the obtained value is divided by an ionic weight; and the divided value is totalized for each of the metal oxides and multiplied by 2. Specifically, the ratio calculation value α is calculated by following Expression (2).

$$\alpha = 2 \cdot \sum (P_i \cdot X_i) = 2 \cdot \sum \{(V_i \cdot G_i / M_i) \cdot X_i\} \quad (2)$$

Here, $P_i$ is $(V_i \cdot G_i / M_i)$. $V_i$ (cm$^3$/mol) is a filling parameter of a metal oxide contained in the supporting glass substrate 10, $G_i$ (kJ/cm$^3$) is a dissociation energy of a metal oxide contained in the supporting glass substrate 10, $M_i$ (g/mol) is a molecular weight of a metal oxide contained in the supporting glass substrate 10, and $X_i$ is a molar ratio of the metal oxide contained in the supporting glass substrate 10 to the entirety of the supporting glass substrate 10. The unit of $X_i$ is dimensionless. As illustrated in Expression (2), the ratio calculation value α is a value obtained such that the value $\{(V_i \cdot G_i / M_i) \cdot X_i\}$ calculated for each of the metal oxides contained in the supporting glass substrate 10 is totalized for all the metal oxides contained in the supporting glass substrate 10, and multiplied by 2. The unit of the ratio calculation value α is GPa·cm$^3$/g.

In addition, $V_i$ is calculated by following Expression (3), and $G_i$ is calculated by following Expression (4).

$$V_i = 6.02 \cdot 10^{23} \cdot (4/3) \cdot \pi \cdot (x \cdot r_M^3 + y \cdot r_0^3) \quad (3)$$

$$G_i = \quad (4)$$
$$d_i / M_i \cdot \{x \cdot \Delta Hf(M_{gas}) + y \cdot \Delta Hf(O_{gas}) - \Delta Hf(M_x O_{ycrystal}) - (x+y) \cdot RT\}$$

Here, $M_x O_y$ is the metal oxide contained in the supporting glass substrate 10.

M is a metal element, O is an oxygen element, x is a valence of the metal element M, and y is a valence of the oxygen element O.

$r_m$ is Shannon's ionic radii of the metal element M in the metal oxide $M_x O_y$, and $r_o$ is Shannon's ionic radii of the oxygen element O in the metal oxide $M_x O_y$. In addition, $d_i$ is the density of the metal oxide $M_x O_y$.

$\Delta Hf$ ($M_{gas}$) is the standard enthalpy of formation of the metal element M in a gas state, $\Delta Hf$ ($O_{gas}$) is the standard enthalpy of formation of the oxygen element O in a gas state, and $\Delta Hf$ ($M_x O_{ycrystal}$) is the standard enthalpy of formation of the metal oxide $M_x O_y$. In addition, R is a gas constant, and T is an absolute temperature.

In the supporting glass substrate 10, the ratio E/d is 32.0 (GPa·cm$^3$/g) or more and the ratio E/d has a value larger than the ratio calculation value α calculated based on the composition.

That is, it can be said that the supporting glass substrate 10 is a member in which the ratio E/d of the Young's modulus to the density, which is obtained by the actual measurement, has a value larger than the ratio calculation value α that is a ratio of the Young's modulus to the density being calculated based on the composition.

Even the supporting glass substrate 10 is manufactured with low thickness and low weight, high rigidity can be achieved, by setting the ratio E/d of the supporting glass substrate 10 to 32.0 (GPa·cm$^3$/g) or more. Therefore, both suppressing deflection and reducing thickness and weight can be achieved. Furthermore, in the supporting glass substrate 10, the ratio E/d has the value larger than the ratio calculation value α calculated based on the composition; in other words, the Young's modulus per unit density is larger than the value expected based on the composition.

Therefore, in the supporting glass substrate 10, suppressing deflection and reducing weight can be achieved to a degree more than expected.

FIG. 2 is a graph for explaining performance of the supporting glass substrate according to the present embodiment. FIG. 2 is a graph illustrating a range of the ratio ε/d described above, in which a horizontal axis represents the ratio calculation value α, and a vertical axis represents the ratio ε/d. The line segment L1a is a border line of the ratio ε/d=32.0 (GPa·cm$^3$/g), and the line segment L2a is a border line of the ratio ε/d=the ratio calculation value α. In FIG. 2, it can be said that the ratio ε/d of the supporting glass substrate 10 is plotted above the line segments L1a and L2a in a vertical axis direction. In other words, it can be said that the ratio ε/d is plotted in the shaded area in FIG. 2.

The ratio ε/d of the supporting glass substrate 10 is more preferably 37.0 (GPa·cm$^3$/g) or more, and even more preferably 40.0 (GPa·cm$^3$/g) or more. When the ratio ε/d is 37.0 (GPa·cm$^3$/g) or more, it is possible to more suitably achieve suppressing deflection and reducing weight, and when the ratio ε/d is 40.0 (GPa·cm$^3$/g) or more, it is possible to even more suitably achieve suppressing deflection and reducing weight.

In FIG. 2, the line segment L1b is a border line of the ratio ε/d=37.0 (GPa·cm$^3$/g), and the line segment L1c is a border line of the ratio ε/d=40.0 (GPa·cm$^3$/g).

In addition, in the supporting glass substrate 10, the ratio ε/d more preferably satisfies following Expression (5), and even more preferably satisfies Expression (6). It is possible to more suitably achieve suppressing deflection and reducing weight by satisfying Expression (5), and it is possible to even more suitably achieve suppressing deflection and reducing weight by satisfying Expression (6).

$$\varepsilon/d > \alpha + 2.0 (\text{GPa} \cdot \text{cm}^3/\text{g}) \quad (5)$$

$$\varepsilon/d > \alpha + 4.0 (\text{GPa} \cdot \text{cm}^3/\text{g}) \quad (6)$$

In FIG. 2, the line segment L2b is a border line of ε/d=α+2.0 (GPa·cm³/g), and the line segment L2c is a border line of ε/d=α+4.0 (GPa·cm³/g).

The supporting glass substrate 10 preferably has a filling density Vt of less than 13.8 (cm³/mol), more preferably has a filling density Vt of less than 13.6 (cm³/mol), and even more preferably has a filling density Vt of less than 13.3 (cm³/mol). When the filling density Vt is within this range, molecules can be densely filled, and it is possible to suitably achieve suppressing deflection and reducing weight. Here, the filling density Vt refers to a filling degree of molecules, and in the present embodiment, the filling density Vt refers to a filling degree of the metal oxide contained in the supporting glass substrate 10. The filling density Vt is a value calculated based on the composition of the supporting glass substrate 10. The filling density Vt is calculated from the following Expression (7).

$$Vt = \sum (V_i \cdot X_i) \quad (7)$$

As described above, $V_i$ of Expression (7) is a filling parameter of a metal oxide contained in the supporting glass substrate 10, and as described above, $X_i$ of Expression (7) is a molar ratio of a metal oxide contained in the supporting glass substrate 10 to the entire supporting glass substrate 10. That is, the filling density Vt is the sum of values obtained by multiplying the filling parameter calculated for each metal oxide by the molar ratio, regarding all of the metal oxides contained in the supporting glass substrate 10.

The supporting glass substrate 10 preferably has a ratio calculation value α of 31.6 (GPa·cm³/g) or more and a filling density Vt of less than 13.8 (cm³/mol). The supporting glass substrate 10 more preferably has a ratio calculation value α of 32.8 (GPa·cm³/g) or more and a filling density Vt of less than 13.8, even more preferably has a ratio calculation value α of 33.1 (GPa·cm³/g) or more and a filling density Vt of less than 13.6 (cm³/mol), and even more preferably has a ratio calculation value α of 33.5 (GPa·cm³/g) or more and a filling density Vt of less than 13.3 (cm³/mol). When the supporting glass substrate 10 having such a relation between the ratio calculation value α and the filling density Vt is used, it is possible to suitably achieve suppressing deflection and reducing weight.

A ratio of the ratio ε/d to the ratio calculation value α, that is, a value obtained by dividing the ratio ε/d by the ratio calculation value α is defined as a structural factor M. That is, the structural factor M refers to a ratio of the measurement value of a specific elastic modulus to the specific elastic modulus calculated from the composition. In this case, it can be said that the structural factor M of the supporting glass substrate 10 is preferably larger than 1, more preferably 1.1 or more, and even more preferably larger than 1.12. When the structural factor M is within this range, it is possible to suitably achieve suppressing deflection and reducing weight.

A ratio of an average molecular weight V of the supporting glass substrate 10 to the density d of the supporting glass substrate 10, that is, a value obtained by dividing the average molecular weight V by the density d is defined as a molecular volume Vm (cm³/mol). The average molecular weight V is a value obtained by calculating the average molecular weight of the supporting glass substrate 10, and the value is calculated based on the composition of the supporting glass substrate 10. For example, a supporting glass substrate containing 50% of $Al_2O_3$ in a molar ratio and 50% of $SiO_2$ in a molar ratio has an average molecular weight V of (101.96×0.5)+(60.08×0.5). It can be said that the molecular volume Vm is a ratio of the average molecular weight calculated from the composition to the measurement value of the density d. The supporting glass substrate 10 preferably has a molecular volume Vm of less than 24.1 (cm³/mol), more preferably has a molecular volume Vm of less than 23.2 (cm³/mol), and even more preferably has a molecular volume Vm of less than 22.7 (cm³/mol). When the molecular volume Vm is within this range, it is possible to suitably achieve densely clogging molecules and suppressing deflection.

Next, the composition of the supporting glass substrate 10 will be described. In the present embodiment, the supporting glass substrate 10 has the composition described later, and thereby, the ratio ε/d can be 32.0 (GPa·cm³/g) or more and can have the value larger than the ratio calculation value α, which is an example of compositions described later. The supporting glass substrate 10 may have any composition as long as the ratio ε/d is 32.0 (GPa·cm³/g) or more and has the value larger than the ratio calculation value α.

The supporting glass substrate 10 contains a base material and an additive material. The supporting glass substrate 10 preferably contains $SiO_2$ and $Al_2O_3$ as base materials. In the supporting glass substrate 10, a total content of $SiO_2$ and $Al_2O_3$ is preferably 50% to 85%, and more preferably 60% to 75%, as represented by mol % based on oxides. Here, 50% to 85% means 50% or more and 85% or less in a case in which the mol % of the total amount of the supporting glass substrate 10 is 100%, the same being applied hereinafter.

In addition, the supporting glass substrate 10 may contain $B_2O_3$ as a base material in addition to $SiO_2$ and $Al_2O_3$. A content of $B_2O_3$ is preferably 1% to 30%, and more preferably 3% to 10%, as represented by mol % based on oxides. The contents of the base materials are in such a range, whereby the ratio ε/d can be increased, and suppressing deflection and reducing weight can be suitably achieved. In addition, the supporting glass substrate 10 may contain at least one of $P_2O_5$, $Ga_2O_3$, AlN, and $Si_3N_4$ as a base material.

The additive material is a metal oxide. The supporting glass substrate 10 contains at least one of MgO, CaO, and $Y_2O_3$ as an additive material. In the supporting glass substrate 10, a content of the additive material, in other words, a total content of one or more components selected from the group consisting of MgO, CaO, and $Y_2O_3$ is preferably in a range of 15% to 50%, and more preferably 20% to 45%, as represented by mol % based on oxides.

The supporting glass substrate 10 preferably contains, among MgO, CaO, and $Y_2O_3$, only MgO, only MgO and CaO, all of MgO, CaO, and $Y_2O_3$, or only $Y_2O_3$, as an additive material. The supporting glass substrate 10 preferably contains MgO of 11% to 35%, and more preferably contains 20% to 30%, as represented by mol % based on oxides. In addition, the supporting glass substrate 10 preferably contains CaO of 7% to 32%, and more preferably contains 8% to 15%, as represented by mol % based on oxides. Furthermore, the supporting glass substrate 10 preferably contains $Y_2O_3$ of 2.8% to 20%, as represented by mol % based on oxides. The contents of the additive materials are in such a range, whereby the ratio ε/d can be increased, and suppressing deflection and reducing weight can be suitably achieved. In addition, the supporting glass substrate 10 may contain at least one selected from the group consisting of $ZrO_2$, $TiO_2$, $Li_2O$, and ZnO in addition to at least one selected from the group consisting of MgO, CaO, and $Y_2O_3$, as an additive material.

Furthermore, the supporting glass substrate 10 preferably has a $SiO_2$ content of 40% to 60%, an $Al_2O_3$ content of 20% to 30%, and a MgO content of 20% to 30%, as represented by mol % based on oxides. In this case, it is preferable that the supporting glass substrate 10 contains only $SiO_2$, $Al_2O_3$, and MgO except for inevitable impurities.

Preferred compositions of the supporting glass substrate 10 will be described more specifically. The supporting glass substrate 10 preferably has parameters such as the ratio ε/d, the structural factor M, and the molecular volume Vm within the range specified above, and the compositions are not particularly limited. That is, various supporting glass substrates are manufactured with any composition, and parameters such as the ratio ε/d, the structural factor M, and the molecular volume Vm are measurement value and calculated for the manufactured supporting glass substrates to obtain the calculated parameters, and a supporting glass substrate having the calculated parameters within the range specified above may be adopted as the supporting glass substrate 10.

The supporting glass substrate 10 preferably has a $SiO_2$ content of 20% to 66%, an $Al_2O_3$ content of 6% to 30%, and a MgO content of 25% to 30%, as represented by mol % based on oxides. Alternatively, the supporting glass substrate 10 preferably has a $SiO_2$ content of 20% to 66%, an $Al_2O_3$ content of 6% to 30%, and the total content of MgO and CaO of 19% to 46%, as represented by mol % based on oxides. Alternatively, the supporting glass substrate 10 preferably has a $SiO_2$ content of 20% to 66%, an $Al_2O_3$ content of 6% to 30%, and the total content of $B_2O_3$ and $Y_2O_3$ of 5.8% to 50%, and more preferably has the total content of $B_2O_3$ and $Y_2O_3$ of 25% to 50%, as represented by mol % based on oxides.

(First Composition)

An example of a preferred composition of the supporting glass substrate 10 is referred to as a first composition. The supporting glass substrate 10 having the first composition has a $SiO_2$ content of 48% to 52%, an $Al_2O_3$ content of 20% to 25%, and a MgO content of 25% to 30%, and preferably contains only $SiO_2$, $Al_2O_3$, and MgO, except for unavoidable impurities.

(Second Composition)

An example of a preferred composition of the supporting glass substrate 10 is referred to as a second composition. The supporting glass substrate 10 having the second composition has a $SiO_2$ content of 43% to 58%, an $Al_2O_3$ content of 12% to 17%, a MgO content of 14% to 27%, and a CaO content of 7% to 32%, and preferably contains only $SiO_2$, $Al_2O_3$, MgO, and CaO, except for unavoidable impurities.

(Third Composition)

An example of a preferred composition of the supporting glass substrate 10 is referred to as a third composition. The supporting glass substrate 10 having the third composition has a $SiO_2$ content of 64% to 68%, an $Al_2O_3$ content of 10% to 14%, a MgO content of 9% to 13%, a CaO content of 6% to 10%, and a $B_2O_3$ content of 1% to 5%, and preferably contains only $SiO_2$, $Al_2O_3$, MgO, CaO, and $B_2O_3$, except for unavoidable impurities.

(Fourth Composition)

An example of a preferred composition of the supporting glass substrate 10 is referred to as a fourth composition. The supporting glass substrate 10 having the fourth composition has a $SiO_2$ content of 55.7% to 59.7%, an $Al_2O_3$ content of 15% to 19%, a MgO content of 13% to 17%, a CaO content of 7% to 11%, and a SrO content of 0.1% to 1%, and preferably contains only $SiO_2$, $Al_2O_3$, MgO, CaO, and SrO, except for unavoidable impurities.

(Fifth Composition)

An example of a preferred composition of the supporting glass substrate 10 is referred to as a fifth composition. The supporting glass substrate 10 having the fifth composition has a $SiO_2$ content of 58% to 59%, an $Al_2O_3$ content of 13% to 14%, a MgO content of 17% to 19%, a CaO content of 7% to 8%, and a $TiO_2$ content of 2% to 4%, and preferably contains only $SiO_2$, $Al_2O_3$, MgO, CaO, and $TiO_2$, except for unavoidable impurities.

(Sixth Composition)

An example of a preferred composition of the supporting glass substrate 10 is referred to as a sixth composition. The supporting glass substrate 10 having the sixth composition has a $SiO_2$ content of 58% to 62%, an $Al_2O_3$ content of 11% to 15%, a MgO content of 15% to 19%, a CaO content of 6% to 10%, and a $ZrO_2$ content of 0.5% to 2%, and preferably contains only $SiO_2$, $Al_2O_3$, MgO, CaO, and $ZrO_2$, except for unavoidable impurities.

(Seventh Composition)

An example of a preferred composition of the supporting glass substrate 10 is referred to as a seventh composition. The supporting glass substrate 10 having the seventh composition has a $SiO_2$ content of 48% to 50%, an $Al_2O_3$ content of 6% to 10%, a MgO content of 12% to 16%, a CaO content of 7% to 11%, a $Y_2O_3$ content of 0.8% to 4.8%, a $TiO_2$ content of 0% to 4%, a $ZrO_2$ content of 0% to 3%, a $LiO_2$ content of 2% to 6%, and a numerical range of ZnO of 4% to 8%, and preferably contains only $SiO_2$, $Al_2O_3$, MgO, CaO, $Y_2O_3$, $TiO_2$, $ZrO_2$, $LiO_2$, and ZnO, except for unavoidable impurities.

(Eighth Composition)

An example of a preferred composition of the supporting glass substrate 10 is referred to as an eighth composition. The supporting glass substrate 10 having the eighth composition has a $SiO_2$ content of 20% to 50%, an $Al_2O_3$ content of 20% to 30%, a $B_2O_3$ content of 5% to 30%, and a $Y_2O_3$ content of 19% to 20%, and preferably contains only $SiO_2$, $Al_2O_3$, $B_2O_3$, and $Y_2O_3$, except for unavoidable impurities.

(Ninth Composition)

An example of a preferred composition of the supporting glass substrate 10 is referred to as a ninth composition. The supporting glass substrate 10 having the ninth composition has a $SiO_2$ content of 38% to 42%, an $Al_2O_3$ content of 18% to 22%, a $B_2O_3$ content of 16% to 20%, a $Y_2O_3$ content of 18% to 22%, and a $P_2O_5$ content of 0% to 4%, and preferably contains only $SiO_2$, $Al_2O_3$, $B_2O_3$, $Y_2O_3$, and $P_2O_5$, except for unavoidable impurities.

(Tenth Composition)

An example of a preferred composition of the supporting glass substrate 10 is referred to as a tenth composition. The supporting glass substrate 10 having the tenth composition has a $SiO_2$ content of 38% to 42%, an $Al_2O_3$ content of 13% to 15%, a $B_2O_3$ content of 18% to 22%, a $Y_2O_3$ content of 18% to 22%, and a $Ga_2O_5$ content of 3% to 7%, and preferably contains only $SiO_2$, $Al_2O_3$, $B_2O_3$, $Y_2O_3$, and $Ga_2O_5$, except for unavoidable impurities.

The supporting glass substrate 10 includes no sintered body. That is, the supporting glass substrate 10 is glass that is not a sintered body. The term "sintered body" as used herein refers to a member obtained by heating a plurality of particles at a temperature lower than a melting point to cause the particles are bonded to each other. The sintered body has a high porosity to some extent since vacancies are contained. By contrast, the supporting glass substrate 10 has a low porosity, usually 0%, since the supporting glass substrate 10 is not a sintered body. However, it is permissible to contain an inevitable small amount of pores. The porosity herein is what is called true porosity, and refers to a value obtained such that a sum of volumes of pores (vacancies) that communicate with the outside and pores (vacancies) that do not communicate with the outside is divided by a total volume (apparent volume). The porosity can be measured according to, for example, JIS R 1634.

The glass used for the supporting glass substrate 10 is usually an amorphous glass, that is, an amorphous solid. In addition, this glass may be a crystallized glass containing crystals on a surface or an inside thereof, but the amorphous glass is preferable from the viewpoint of the density. The sintered body (ceramics) cannot be used due to the low transmittance and the high density.

Next, a shape of the supporting glass substrate 10 will be described. As illustrated in FIG. 1, the supporting glass substrate 10 is a plate-shaped glass substrate including a first surface 12 that is one surface, a second surface 14 that is the other surface, and a side surface 16. The second surface 14 is a surface opposite to the first surface 12, and is, for example, parallel to the first surface 12. The side surface 16 is a side surface of the supporting glass substrate 10 and can be said to be an end surface that connects the first surface 12 and the second surface 14.

In a plan view, that is, in a case of being viewed from a direction orthogonal to the first surface 12, the supporting glass substrate 10 has a circular disc shape. The supporting glass substrate 10 is not limited to a disc shape, and may have any shape, for example, a polygonal plate such as a rectangle.

In addition, a thickness D2 of the supporting glass substrate 10, that is, a length between the first surface 12 and the second surface 14 is preferably 0.1 mm to 2.0 mm, and more preferably 0.1 mm to 0.5 mm. The thickness D2 is set to 0.1 mm or more, whereby the supporting glass substrate 10 can be prevented from becoming too thin. Thus, the deflection or the damage due to an impact can be suppressed. The thickness D2 is set to 2.0 mm or less, whereby an increase in weight can be suppressed, and the thickness D2 is set to 0.5 mm or less, whereby the increase in weight can more suitably be suppressed.

A method of manufacturing the supporting glass substrate 10 is not particularly limited, and any method may be employed. For example, the supporting glass substrate 10 may be manufactured by a method of charging various raw materials such as silica sand and soda ash, which are raw materials of compounds to be contained in the supporting glass substrate 10, into a continuous melting furnace, heating and melting the charged materials at 1500° C. to 1600° C., performing fining, then feeding the resultant to a molding device, molding the fed molten glass into a plate shape, and gradually cooling the plate-shaped glass. Various methods can be employed for manufacturing the supporting glass substrate 10, and examples thereof include a melt casting method, a down draw method (for example, an overflow down draw method, a slot down method, and a redraw method), a float method, a roll out method, a press method, and the like.

Next, an example of a manufacturing process in a case in which the supporting glass substrate 10 is used for manufacturing the FOWLP will be described. In the manufacture of the FOWLP, a plurality of semiconductor chips are bonded onto the supporting glass substrate 10, and the semiconductor chips are covered with a sealing material to form an element substrate. The supporting glass substrate 10 and the element substrate are separated from each other, and an opposite side of the element substrate to the semiconductor chips is bonded onto, for example, another supporting glass substrate 10. Then, wiring, solder bumps, and the like are formed on the semiconductor chips, and the element substrate and the supporting glass substrate 10 are separated again. Furthermore, the element substrate is cut into respective semiconductor chips to be individualized to obtain a semiconductor device.

As described above, in the supporting glass substrate 10 according to the present embodiment, the ratio ε/d is 32.0 (GPa·cm3/g) or more and has the value larger than the ratio calculation value α. The ratio ε/d is the ratio of the Young's modulus ε to the density d of the supporting glass substrate 10. The ratio calculation value α is the ratio of the Young's modulus to the density calculated from the composition of the supporting glass substrate 10, and is represented by above-described Expression (2).

There is a case in which the glass substrate is required to achieve both suppressing deflection and reducing weight. It is usually necessary to increase the thickness in order to suppress the deflection; however, it is necessary to reduce the thickness in order to reduce the weight. Therefore, it is difficult to achieve both suppressing deflection and reducing weight. By contrast, in the supporting glass substrate 10 according to the present embodiment, the deflection can be suppressed by setting the ratio ε/d of the supporting glass substrate 10 to 32.0 (GPa·cm$^3$/g) or more due to the high Young's modulus, even though the thickness of the supporting glass substrate 10 is reduced in order to reduce the weight. Thus it is possible to achieve both suppressing deflection and reducing weight.

Furthermore, in the supporting glass substrate 10, the ratio ε/d has the value larger than the ratio calculation value α calculated based on the composition. In other words, the Young's modulus per unit density is larger than a value expected based on the composition. Therefore, in the supporting glass substrate 10, suppressing deflection and reducing weight can be achieved to a degree more than expected.

The supporting glass substrate 10 preferably has a ratio ε/d of 37.0 (GPa·cm$^3$/g) or more, a structural factor M of 1.1 or more, and a filling density Vt of less than 13.8 (cm$^3$/mol). In the supporting glass substrate 10 satisfying such conditions, suppressing deflection and reducing weight can be achieved to a degree more than expected.

The supporting glass substrate 10 preferably has a ratio calculation value α of 31.6 (GPa·cm$^3$/g) or more and a filling density Vt of less than 13.8 (cm$^3$/mol). When the ratio calculation value α and the filling density Vt are within this range, suppressing deflection and reducing weight can be achieved to a degree more than expected.

The supporting glass substrate 10 preferably satisfies a relation represented as the ratio ε/d> the ratio calculation value α+2.0 (GPa·cm$^3$/g), and more preferably satisfies a relation represented as the ratio ε/d> the ratio calculation value α+4.0 (GPa·cm$^3$/g). By satisfying these relations, it is possible to more suitably achieve suppressing deflection and reducing weight.

In addition, in the supporting glass substrate 10, the ratio ε/d is preferably 37.0 (GPa·cm$^3$/g) or more, and the ratio ε/d is even more preferably 40.0 (GPa·cm$^3$/g) or more. The ratio ε/d has the values, whereby suppressing deflection and reducing weight can be suitably achieved.

In addition, in the supporting glass substrate 10, the total content of one or more components selected from the group consisting of MgO, CaO, and $Y_2O_3$ is preferably in the range of 15% to 50% with respect to the total amount of the supporting glass substrate 10, in terms of mol %. The supporting glass substrate 10 contains such materials in such contents, thereby having the higher Young's modulus ε than expected. Therefore, suppressing deflection and reducing weight can be more suitably achieved.

In addition, in the supporting glass substrate 10, the total content of $SiO_2$ and $Al_2O_3$ is in the range of 50% to 85% with respect to the total amount of the supporting glass substrate 10, in terms of mol %. The supporting glass substrate 10 has the above-described composition, thereby having the higher Young's modulus ε than expected, so that suppressing deflection and reducing weight can be more suitably achieved.

In addition, the supporting glass substrate 10 preferably has the thickness D2 in the range of 0.1 mm to 0.5 mm. The thickness D2 is within this range, whereby the weight can be reduced while suppressing the deflection or the damage due to an impact.

In addition, the supporting glass substrate 10 is glass that is not a sintered body. Since the supporting glass substrate 10 is not a sintered body, it is possible to reduce the weight by suppressing the density from becoming too high. Furthermore, since scattering of light due to pores which the sintered body may have does not occur, light transmittance can be secured.

In addition, the supporting glass substrate 10 is preferably an amorphous glass. Since the supporting glass substrate 10 is the amorphous glass, it is possible to reduce the weight by suppressing the density from becoming too high.

The supporting glass substrate 10 is preferably a supporting glass substrate for manufacturing the FOWLP and the like; in other words, at least one of the fan out wafer level package and the fan out panel level package. When the supporting glass substrate 10 is used at least one of manufacturing the fan out wafer level package and manufacturing the fan out panel level package, it is possible to suitably manufacture a semiconductor package.

EXAMPLES

Next, Examples will be described. The embodiment may be modified as long as the effects of the invention are exhibited.

In Examples and Comparative examples, supporting glass substrates having different compositions were prepared. Then, a ratio calculation value α was calculated for each supporting glass substrate, and a Young's modulus ε and a density d were measured to calculate a ratio ε/d. In addition, a deflection amount and a mass were also measured for each supporting glass substrate, and the supporting glass substrates were evaluated based on the deflection amount and the mass. The details will be described below.

Table 1 illustrates materials used for the supporting glass substrates in Examples and Comparative Examples. Table 1 illustrates the contents of the materials used for preparing the supporting glass substrates with respect to the supporting glass substrates of Example 1 to Example 17 and Comparative Example 1 to Comparative Example 11, as represented by mol % based on oxides. Table 2 illustrates the contents of the materials used for preparing the supporting glass substrates with respect to the supporting glass substrates of Example 18 to Example 26, as represented by mol % based on oxides.

In each of Examples and Comparative Examples, a raw plate having a diameter of 320 mm and a thickness of 6 mm was manufactured by using a melt casting method with each composition in Tables 1 and 2. Next, a plurality of plates each of which has a diameter of 300 mm from the center of the raw plate and a thickness of 3 mm were cut out. Both surfaces of each plate were subjected to double-sided polishing using cerium oxide as a polishing material, and the respective plates were adjusted to have thicknesses of 0.4 mm, 0.7 mm, 1.3 mm, or 2.0 mm to prepare supporting glass substrates.

The supporting glass substrates thus prepared were used as samples for the evaluations.

TABLE 1

| | Material composition (mol %) | | | | | | | | | | |
|---|---|---|---|---|---|---|---|---|---|---|---|
| | $SiO_2$ | $Al_2O_3$ | $B_2O_3$ | $P_2O_5$ | $Ga_2O_3$ | MgO | CaO | SrO | BaO | $La_2O_3$ | $Y_2O_3$ |
| Example 1 | 50 | 25 | | | | 25 | | | | | |
| Example 2 | 50 | 20 | | | | 30 | | | | | |
| Example 3 | 43 | 12 | | | | 14 | 32 | | | | |
| Example 4 | 56 | 12 | | | | 24 | 9 | | | | |
| Example 5 | 66 | 12 | 3 | | | 11 | 8 | | | | |
| Example 6 | 53 | 15 | | | | 25 | 7 | | | | |
| Example 7 | 52 | 12 | | | | 22 | 15 | | | | |
| Example 8 | 53 | 12 | | | | 27 | 8 | | | | |
| Example 9 | 53 | 15 | | | | 21 | 10 | | | | |
| Example 10 | 50 | 20 | 10 | | | | | | | | 20 |
| Example 11 | 50 | 6 | 3 | | | 14 | 9 | | | | 2.8 |
| Example 12 | 55 | 20 | 5 | | | | | | | | 20 |
| Example 13 | 40 | 20 | 18 | 2 | | | | | | | 20 |
| Example 14 | 48 | 10 | 5 | | | 14 | 9 | | | | 2.8 |
| Example 15 | 20 | 30 | 30 | | | | | | | | 20 |
| Example 16 | 36 | 25 | 20 | | | | | | | | 19 |
| Example 17 | 40 | 15 | 20 | | 5 | | | | | | 20 |
| Comparative Example 1 | 56 | 24 | | | | | | | | | |
| Comparative Example 2 | 64.1 | 15.4 | | 2.44 | | | | | | | |
| Comparative Example 3 | 60 | | | | | | | | 40 | | |
| Comparative Example 4 | 50 | 20 | | | | | | | | | |

TABLE 1-continued

| | SiO₂ | Al₂O₃ | B₂O₃ | P₂O₅ | Ga₂O₃ | MgO | CaO | SrO | BaO | La₂O₃ | Y₂O₃ |
|---|---|---|---|---|---|---|---|---|---|---|---|
| Comparative Example 5 | 60 | | | | | | | | 20 | | |
| Comparative Example 6 | | | | | | | | | 20 | | |
| Comparative Example 7 | | | | | | | | | | | |
| Comparative Example 8 | 6 | 8 | 53 | | | | | | 15 | 1.5 | |
| Comparative Example 9 | 40 | | 10 | | | | | | 15 | | |
| Comparative Example 10 | 67.1 | 13.1 | 3.6 | | | 2.3 | | | | | |
| Comparative Example 11 | 48 | 32 | | | | | | | | | |

| | Material composition (mol %) | | | | | | | | | | |
|---|---|---|---|---|---|---|---|---|---|---|---|
| | ZrO₂ | TiO₂ | Li₂O | Na₂O | K₂O | ZnO | Nb₂O₅ | TeO₂ | Fe₂O₃ | GeO₂ | Gd₂O₃ |
| Example 1 | | | | | | | | | | | |
| Example 2 | | | | | | | | | | | |
| Example 3 | | | | | | | | | | | |
| Example 4 | | | | | | | | | | | |
| Example 5 | | | | | | | | | | | |
| Example 6 | | | | | | | | | | | |
| Example 7 | | | | | | | | | | | |
| Example 8 | | | | | | | | | | | |
| Example 9 | | | | | | | | | | | |
| Example 10 | | | | | | | | | | | |
| Example 11 | 1.2 | 2 | 4 | | | 8 | | | | | |
| Example 12 | | | | | | | | | | | |
| Example 13 | | | | | | | | | | | |
| Example 14 | 1.2 | 2 | 4 | | | 4 | | | | | |
| Example 15 | | | | | | | | | | | |
| Example 16 | | | | | | | | | | | |
| Example 17 | | | | | | | | | | | |
| Comparative Example 1 | | | | 20 | | | | | | | |
| Comparative Example 2 | | | 6.17 | 10.7 | 0.03 | 1.12 | | | | | |
| Comparative Example 3 | | | | | | | | | | | |
| Comparative Example 4 | | | | 30 | | | | | | | |
| Comparative Example 5 | | | 20 | | | | | | | | |
| Comparative Example 6 | | | | | | | | 80 | | | |
| Comparative Example 7 | | | | | | | | 80 | 20 | | |
| Comparative Example 8 | | | | | 15 | | 1.5 | | | | |
| Comparative Example 9 | | | | | 15 | | | 10 | | 10 | |
| Comparative Example 10 | | | | 13.7 | 0.1 | | | | | | |
| Comparative Example 11 | | | | | | | | | | | 20 |

TABLE 2

| | Material composition (% by mol) | | | | | | | | | | |
|---|---|---|---|---|---|---|---|---|---|---|---|
| | SiO₂ | Al₂O₃ | B₂O₃ | P₂O₅ | Ga₂O₃ | MgO | CaO | SrO | BaO | La₂O₃ | Y₂O₃ |
| Example 18 | 58 | 17.4 | | | | 15.3 | 9.3 | | | | |
| Example 19 | 57.7 | 17.3 | | | | 15.3 | 9.3 | 0.4 | | | |
| Example 20 | 59.4 | 13 | | | | 17.3 | 8.3 | | | | |
| Example 21 | 60 | 13.1 | | | | 17.5 | 8.4 | | | | |
| Example 22 | 58.4 | 14 | | | | 18.8 | 6.8 | | | | |
| Example 23 | 58.9 | 12.8 | | | | 17.1 | 8.2 | | | | |
| Example 24 | 58.2 | 12.7 | | | | 16.9 | 8.2 | | | | |
| Example 25 | 55 | 12 | | | | 21 | 12 | | | | |
| Example 26 | 53 | 12 | | | | 21 | 14 | | | | |
| Example 27 | 50 | 11 | | | | 15 | 24 | | | | |

TABLE 2-continued

| | Material composition (% by mol) | | | | | | | | | |
|---|---|---|---|---|---|---|---|---|---|---|
| | ZrO$_2$ | TiO$_2$ | Li$_2$O | Na$_2$O | K$_2$O | ZnO | Nb$_2$O$_5$ | TeO$_2$ | Fe$_2$O$_3$ | GeO$_2$ | Gd$_2$O$_3$ |
| Example 18 | | | | | | | | | | |
| Example 19 | | | | | | | | | | |
| Example 20 | | 2 | | | | | | | | |
| Example 21 | 1 | | | | | | | | | |
| Example 22 | | 2 | | | | | | | | |
| Example 23 | | 3 | | | | | | | | |
| Example 24 | | 4 | | | | | | | | |
| Example 25 | | | | | | | | | | |
| Example 26 | | | | | | | | | | |
| Example 27 | | | | | | | | | | |

In Examples and Comparative Examples, the ratio calculation value α was calculated for each supporting glass substrate that is prepared as a sample, based on the material compositions listed in Table 1. Then, the Young's modulus ε was measured for each supporting glass substrate that is prepared as a sample using 38DL PLUS manufactured by Olympus Corporation, the density d was measured by the Archimedes' method, and the ratio ε/d was calculated based on the measured Young's modulus ε and density d.

FIG. 3 is a schematic diagram illustrating a method of measuring deflection in Examples and Comparative Examples. In Examples and Comparative Examples, for each supporting glass substrate that is prepared as a sample, deflection due to its own weight was measured. Specifically, as illustrated in FIG. 3, a deflection amount at a center portion (indicated by an arrow in FIG. 3) of a first surface 12, in a case in which a second surface 14 of the supporting glass substrate used as a sample was supported at three points by supporting units B, was measured with Dyvoce manufactured by Kohzu Precision Co., Ltd. A diameter of each supporting unit B was 1.6 mm, and the supporting unit B was arranged such that a central position was overlapped at 5.0 mm radially inward from an outer peripheral portion of the supporting glass substrate. In addition, the mass was measured for each supporting glass substrate that is prepared as a sample.

Table 3 lists the evaluation results of Examples and Comparative Examples. FIG. 4 is a graph illustrating features of the supporting glass substrates of Examples and Comparative Examples. Table 3 illustrates, for each supporting glass substrate used as a sample, the ratio calculation value α, the Young's modulus ε, the density d, the ratio ε/d, the deflection amount for each thickness D2, the mass of the sample having a thickness of 2.0 mm, the determination result of the deflection and mass, and the comprehensive determination result.

As illustrated in Table 3, in Example 1 to Example 17, the ratio ε/d is 32.0 (GPa·cm$^3$/g) or more, and the ratio ε/d is larger than the ratio calculation value α. By contrast, Comparative Example 1 to Comparative Example 11 do not satisfy at least one of a condition that the ratio ε/d is 32.0 (GPa·cm$^3$/g) or more and a condition that the ratio ε/d is larger than the ratio calculation value α.

FIG. 4 is a graph in which a relation between the ratio ε/d of the supporting glass substrate used as a sample and the ratio calculation value α of the supporting glass substrate used as a sample is plotted. Black circles in FIG. 4 indicate the supporting glass substrates of Example 1 to Example 17, and crosses indicate the supporting glass substrates of Comparative Example 1 to Comparative Example 11. In FIG. 4, it is also found that the supporting glass substrates of Example 1 to Example 17 have the ratio ε/d of 32.0 (GPa·cm$^3$/g) or more, and have the ratio ε/d larger than the ratio calculation value α, and the supporting glass substrates of Comparative Example 1 to Comparative Example 11 do not satisfy at least one of those conditions. According to FIG. 4, it is found that in the present examples, the ratio ε/d deviates from the ratio calculation value α that is the calculated value, but in Comparative Examples, the ratio ε/d of a sample the ratio ε/d of which is particularly high does not deviate from the ratio calculation value α that is the calculated value.

TABLE 3

| | Ratio calculation value α | Measurement result | | | | | | | | | |
|---|---|---|---|---|---|---|---|---|---|---|---|
| | | Young's modulus (ε) | Density (d) | Ratio ε/d | Deflection (mm) | | | | Mass (g) | Determination | Comprehensive determination |
| | | | | | 0.4 mm | 0.7 mm | 1.3 mm | 2.0 mm | 2.0 mm | Deflection | Mass | |
| Example 1 | 36.8 | 111 | 2.68 | 41.4 | 0.79 | 0.26 | 0.08 | 0.03 | 378.9 | A | A | A |
| Example 2 | 36.0 | 111 | 2.69 | 41.1 | 0.79 | 0.26 | 0.08 | 0.03 | 380.0 | A | A | A |
| Example 3 | 31.0 | 105 | 2.86 | 36.6 | 0.88 | 0.29 | 0.08 | 0.04 | 404.2 | B | B | B |
| Example 4 | 33.5 | 100 | 2.66 | 37.7 | 0.87 | 0.29 | 0.08 | 0.04 | 375.6 | B | A | B |
| Example 5 | 32.7 | 89 | 2.50 | 35.7 | 0.92 | 0.31 | 0.09 | 0.04 | 354.1 | C | A | C |
| Example 6 | 34.3 | 103 | 2.68 | 38.4 | 0.85 | 0.28 | 0.08 | 0.03 | 378.9 | B | A | B |
| Example 7 | 32.8 | 104 | 2.73 | 38.1 | 0.85 | 0.28 | 0.08 | 0.03 | 385.7 | B | A | B |
| Example 8 | 33.6 | 102 | 2.69 | 37.9 | 0.86 | 0.29 | 0.08 | 0.04 | 380.9 | B | A | B |
| Example 9 | 33.9 | 101 | 2.68 | 37.8 | 0.87 | 0.29 | 0.08 | 0.04 | 378.7 | B | A | B |
| Example 10 | 30.0 | 118 | 3.44 | 34.4 | 0.94 | 0.31 | 0.09 | 0.04 | 486.3 | C | C | C |
| Example 11 | 29.8 | 107 | 3.02 | 35.5 | 0.92 | 0.31 | 0.09 | 0.04 | 427.2 | C | B | C |
| Example 12 | 31.1 | 119 | 3.49 | 34.1 | 0.95 | 0.32 | 0.09 | 0.04 | 492.8 | C | C | C |
| Example 13 | 27.8 | 113 | 3.37 | 33.4 | 0.97 | 0.32 | 0.09 | 0.04 | 476.1 | C | C | C |

TABLE 3-continued

| | Ratio calculation value α | Young's modulus (ε) | Density (d) | Ratio ε/d | Deflection (mm) 0.4 mm | 0.7 mm | 1.3 mm | 2.0 mm | Mass (g) 2.0 mm | Determination Deflection | Mass | Comprehensive determination |
|---|---|---|---|---|---|---|---|---|---|---|---|---|
| Example 14 | 30.9 | 106 | 2.91 | 36.3 | 0.90 | 0.30 | 0.09 | 0.04 | 411.5 | C | B | C |
| Example 15 | 27.3 | 122 | 3.38 | 36.2 | 0.90 | 0.30 | 0.09 | 0.04 | 477.5 | C | C | C |
| Example 16 | 28.8 | 117 | 3.36 | 35.0 | 0.93 | 0.31 | 0.09 | 0.04 | 474.5 | C | C | C |
| Example 17 | 26.2 | 116 | 3.52 | 32.8 | 0.98 | 0.33 | 0.09 | 0.04 | 497.9 | C | C | C |
| Comparative Example 1 | 32.1 | 75 | 2.46 | 30.4 | 1.07 | 0.36 | 0.10 | 0.04 | 347.2 | D | A | D |
| Comparative Example 2 | 32.3 | 77 | 2.43 | 31.6 | 1.04 | 0.35 | 0.10 | 0.04 | 343.5 | D | A | D |
| Comparative Example 3 | 22.7 | 79 | 3.45 | 22.8 | 1.39 | 0.47 | 0.14 | 0.06 | 487.7 | D | C | D |
| Comparative Example 4 | 29.3 | 73 | 2.51 | 28.9 | 1.12 | 0.38 | 0.11 | 0.05 | 354.9 | D | A | D |
| Comparative Example 5 | 29.2 | 89 | 3.01 | 29.4 | 1.10 | 0.37 | 0.11 | 0.05 | 425.5 | D | B | D |
| Comparative Example 6 | 9.3 | 49 | 5.55 | 8.7 | 3.17 | 1.22 | 0.36 | 0.15 | 785.2 | D | D | D |
| Comparative Example 7 | 12.3 | 61 | 5.22 | 11.6 | 2.53 | 0.94 | 0.27 | 0.12 | 738.2 | D | D | D |
| Comparative Example 8 | 15.9 | 49 | 3.00 | 16.4 | 1.87 | 0.66 | 0.19 | 0.08 | 424.4 | D | B | D |
| Comparative Example 9 | 17.9 | 70 | 3.53 | 19.8 | 1.58 | 0.55 | 0.16 | 0.07 | 499.2 | D | C | D |
| Comparative Example 10 | 30.5 | 69 | 2.39 | 29.0 | 1.13 | 0.38 | 0.11 | 0.05 | 337.9 | D | A | D |
| Comparative Example 11 | 33.1 | 126 | 4.39 | 28.8 | 1.13 | 0.38 | 0.11 | 0.05 | 620.1 | D | D | D |

In the determination of the deflection amount in Table 3,
a case in which the deflection amount is less than 0.8 mm is denoted by A,
a case in which the deflection amount is 0.8 mm or more and less than 0.9 mm is denoted by B,
a case in which the deflection amount is 0.9 mm or more and less than 1.0 mm is denoted by C, and
a case in which the deflection amount is 1.0 mm or more is denoted by D.
A, B, and C are determined to be acceptable.
In the determination of the mass in Table 3,
a case in which the mass is less than 400 g is denoted by A,
a case in which the mass is 400 g or more and less than 430 g is denoted by B,
a case in which the mass is 430 g or more and less than 500 g is denoted by C, and
a case in which the mass is 500 g or more is denoted by D.
A, B, and C are determined to be acceptable.
In addition, in a case in which both the deflection amount and the mass are denoted by A, the comprehensive determination is denoted by A,
in a case in which both the deflection amount and the mass are not denoted by C or D and at least one of the deflection amount and the mass is denoted by B, the comprehensive determination is denoted by B,
in a case in which both the deflection amount and the mass are not denoted by D and at least one of the deflection amount and the mass is denoted by C, the comprehensive determination is denoted by C, and
in a case in which at least one of the deflection amount and the mass is denoted by D, the comprehensive determination is denoted by D.
In the comprehensive determination, A, B, and C are also determined to be acceptable.

As listed in Table 3, the deflection amount and the mass of each of the supporting glass substrates according to Example 1 to Example 17 were determined to be acceptable. By contrast, at least one of the deflection amount and the mass of each of the supporting glass substrates according to Comparative Example 1 to Comparative Example 11 was determined to be unacceptable. That is, it is found that in the supporting glass substrates of the present examples, each of which has the ratio ε/d of 32.0 (GPa·cm³/g) or more and the ratio ε/d larger than the ratio calculation value α, both suppressing deflection and reducing weight were achieved.

Table 4 lists the measurement results of the ratio calculation values α and the ratios ε/d from Example 18 to Example 27. As illustrated in Table 4, in Example 18 to Example 27, the ratios ε/d are 32.0 (GPa·cm³/g) or more, and the ratios ε/d are larger than the ratio calculation values α.

TABLE 4

| | Ratio calculation value α | Young's modulus (ε) | Density (d) | Ratio (ε/d) |
|---|---|---|---|---|
| Example 18 | 34.3 | 98 | 2.62 | 37.6 |
| Example 19 | 34.2 | 98 | 2.62 | 37.2 |
| Example 20 | 33.7 | 97 | 2.61 | 37.0 |
| Example 21 | 33.6 | 99 | 2.65 | 37.2 |
| Example 22 | 34.1 | 99 | 2.64 | 37.5 |
| Example 23 | 33.7 | 98 | 2.63 | 37.1 |
| Example 24 | 33.8 | 98 | 2.64 | 37.1 |
| Example 25 | 33.1 | 100 | 2.67 | 37.3 |
| Example 26 | 32.9 | 101 | 2.71 | 37.4 |
| Example 27 | 31.6 | 100 | 2.77 | 36.0 |

Table 5 lists the ratio ε/d, the structural factor M, the molecular volume Vm, the ratio calculation value α, and the filling density Vt for the supporting glass substrates of Examples and Comparative Examples. As illustrated in Table 5, in Examples 1, 3 to 4, 6 to 9, and 20 to 26, it can be seen that the ratios ε/d are 37.0 (GPa·cm³/g) or more, which are larger than the ratio calculation values α, the structural factors M are 1.1 or more, and the molecular volumes Vm are less than 24.1. As illustrated in Table 5, in Examples 2, 4, 6 to 9, and 20 to 27, it can be seen that the ratio calculation values α are 31.6 (GPa·cm³/g) or more, and the filling densities Vt are less than 13.8 (cm³/mol).

TABLE 5

|  | Ratio ε/d (GPa·cm³/g) | Structural factor M | Molecular volume Vm (cm³/mol) | Ratio calculation value α (GPa·cm³/g) | Filling density Vt (cm³/mol) |
| --- | --- | --- | --- | --- | --- |
| Example 1 | 41.4 | 1.12 | 23.3 | 36.8 | 14.3 |
| Example 2 | 41.1 | 1.14 | 24.4 | 36.0 | 13.6 |
| Example 3 | 36.6 | 1.18 | 21.4 | 31.0 | 12.6 |
| Example 4 | 37.7 | 1.12 | 22.6 | 33.5 | 13.0 |
| Example 5 | 35.7 | 1.09 | 25.2 | 32.7 | 14.0 |
| Example 6 | 38.4 | 1.12 | 22.8 | 34.3 | 13.2 |
| Example 7 | 38.1 | 1.16 | 22.0 | 32.8 | 12.8 |
| Example 8 | 37.9 | 1.13 | 22.0 | 33.6 | 12.8 |
| Example 9 | 37.8 | 1.11 | 23.1 | 33.9 | 13.3 |
| Example 10 | 34.4 | 1.15 | 29.8 | 30.0 | 18.3 |
| Example 11 | 35.5 | 1.19 | 21.9 | 29.8 | 12.9 |
| Example 12 | 34.1 | 1.10 | 29.3 | 31.1 | 18.0 |
| Example 13 | 33.4 | 1.20 | 31.2 | 27.8 | 19.3 |
| Example 14 | 36.3 | 1.17 | 23.0 | 30.9 | 13.6 |
| Example 15 | 36.2 | 1.32 | 32.2 | 27.3 | 20.4 |
| Example 16 | 35 | 1.21 | 31.0 | 28.8 | 19.3 |
| Example 17 | 32.8 | 1.25 | 30.6 | 26.2 | 19.0 |
| Example 18 | 37.6 | 1.10 | 24.4 | 34.3 | 13.9 |
| Example 19 | 37.2 | 1.09 | 24.4 | 34.2 | 13.9 |
| Example 20 | 37 | 1.10 | 23.8 | 33.7 | 13.5 |
| Example 21 | 37.2 | 1.11 | 23.6 | 33.6 | 13.5 |
| Example 22 | 37.5 | 1.10 | 23.7 | 34.1 | 13.5 |
| Example 23 | 37.1 | 1.10 | 23.7 | 33.7 | 13.5 |
| Example 24 | 37.1 | 1.10 | 23.7 | 33.8 | 13.5 |
| Example 25 | 37.3 | 1.13 | 22.6 | 33.1 | 13.0 |
| Example 26 | 37.4 | 1.14 | 22.3 | 32.9 | 12.9 |
| Example 27 | 36.0 | 1.14 | 21.9 | 31.6 | 12.7 |
| Comparative Example 1 | 30.4 | 0.95 | 28.7 | 32.1 | 15.2 |
| Comparative Example 2 | 31.6 | 0.98 | 27.6 | 32.3 | 14.9 |
| Comparative Example 3 | 22.8 | 1.00 | 22.5 | 22.7 | 12.6 |
| Comparative Example 4 | 28.9 | 0.99 | 27.5 | 29.3 | 14.6 |
| Comparative Example 5 | 29.4 | 1.01 | 20.9 | 29.2 | 12.1 |
| Comparative Example 6 | 8.7 | 0.94 | 28.5 | 9.3 | 14.4 |
| Comparative Example 7 | 11.6 | 0.95 | 30.6 | 12.3 | 16.2 |
| Comparative Example 8 | 16.4 | 1.03 | 44.3 | 15.9 | 26.8 |
| Comparative Example 9 | 19.8 | 1.11 | 25.4 | 17.9 | 14.2 |
| Comparative Example 10 | 29 | 0.95 | 27.5 | 30.5 | 14.7 |
| Comparative Example 11 | 28.8 | 0.87 | 30.5 | 33.1 | 19 |

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A supporting glass substrate, comprising:
an amorphous glass comprising $SiO_2$, $Al_2O_3$, and MgO, wherein a total content of $SiO_2$ and $Al_2O_3$ is in a range of 55 mol % to 75 mol %, and a content of MgO is in a range of 11 mol % to 35 mol % with respect to a total amount of the supporting glass substrate, a ratio of a Young's modulus ε to a density d is 37.0 GPa cm³/g or more, a filling density Vt is less than 13.8 cm³/mol and is defined as $$Vt = \sum (V_i \cdot X_i),$$

where $V_i$ is a filling parameter of a metal oxide in the supporting glass substrate and $X_i$ is a molar ratio of a metal oxide in the supporting glass substrate, a ratio calculation value α in GPa·cm³/g is $$\alpha = 2 \cdot \sum \{(V_i \cdot G_i / M_i) \cdot X_i\},$$

where $G_i$ is a dissociation energy of a metal oxide in the supporting glass substrate and $M_i$ is a molecular weight of a metal oxide in the supporting glass substrate, and a structural factor M is 1.1 or more and is defined as a ratio of ε/d to the ratio calculation value α.

2. The supporting glass substrate of claim 1, wherein the supporting glass substrate satisfies ε/d>α+2.0 GPa·cm³/g.

3. The supporting glass substrate of claim 2, wherein the supporting glass substrate satisfies ε/d>α+4.0 GPa cm³/g.

4. The supporting glass substrate of claim 1, wherein ε/d is 40.0 GPa cm³/g or more.

5. A supporting glass substrate, comprising:
amorphous glass comprising $SiO_2$ and MgO,
wherein a content of MgO is 11 mol % to 35 mol % with respect to a total amount of the supporting glass substrate, a filling density Vt is less than 13.8 cm³/mol, which is calculated from a composition by $$Vt = \sum (V_i \cdot X_i),$$

where $V_i$ is a filling parameter of a metal oxide contained in the supporting glass substrate, and $X_i$ is a molar ratio of a metal oxide contained in the supporting glass substrate, and a ratio calculation value α is 31.6 GPa cm³/g or more as defined by $$\alpha = 2 \cdot \sum \{(V_i \cdot G_i / M_i) \cdot X_i\},$$

where $G_i$ is a dissociation energy of a metal oxide contained in the supporting glass substrate, and $M_i$ is a molecular weight of a metal oxide contained in the supporting glass substrate wherein the supporting glass substrate is an amorphous glass.

6. The supporting glass substrate of claim 1, wherein a total content of at least one component selected from the group consisting of MgO, CaO, and $Y_2O_3$ is 15 mol % to 50 mol % with respect to a total amount of the supporting glass substrate.

7. The supporting glass substrate of claim 6, wherein a total content of $SiO_2$ and $Al_2O_3$ is 50 mol % to 85 mol % with respect to a total amount of the supporting glass substrate, in terms of mol %.

8. The supporting glass substrate of claim 1, wherein the supporting glass substrate has a thickness in a range of 0.1 mm to 0.5 mm.

9. The supporting glass substrate of claim 1, wherein the supporting glass substrate is configured to manufacture a fan out wafer level package or a fan out panel level package.

10. The supporting glass substrate of claim 1, wherein the amorphous glass includes CaO such that the total content of $SiO_2$ and $Al_2O_3$ is 60 mol % or more and less than 75 mol %, the content of MgO is 11 mol % to 35 mol %, and a content of CaO is 7 mol % to 15 mol % with respect to a total amount of the supporting glass substrate.

11. The supporting glass substrate of claim 1, wherein the total content of $SiO_2$ and $Al_2O_3$ is 70 mol % or more and less than 75%, and the content of MgO is more than 25 mol % and 30 mol % or less with respect to a total amount of the supporting glass substrate.

12. The supporting glass substrate of claim 1, wherein the amorphous glass includes CaO such that a content of CaO is 7 mol % to 32 mol % with respect to a total amount of the supporting glass substrate.

13. The supporting glass substrate of claim 1, wherein the amorphous glass includes $Y_2O_3$ such that a content of $Y_2O_3$ is 2.8 mol % to 20 mol % based on oxides with respect to a total amount of the supporting glass substrate.

14. The supporting glass substrate of claim 1, wherein the amorphous glass includes at least one selected from the group consisting of $B_2O_3$, $P_2O_5$, $Ga_2O_3$, AlN, $Si_3N_4$, $ZrO_2$, $TiO_2$, $Li_2O$, and ZnO.

15. The supporting glass substrate of claim 1, wherein the amorphous glass includes $B_2O_3$ such that a content of $B_2O_3$ is 3 mol % to 10 mol % based on oxides with respect to a total amount of the supporting glass substrate.

16. The supporting glass substrate of claim 1, wherein a structural factor M is 1.12 or more.

17. The supporting glass substrate of claim 5, wherein the amorphous glass includes CaO such that a content of CaO is 7 mol % to 32 mol % with respect to a total amount of the supporting glass substrate.

18. The supporting glass substrate of claim 5, wherein the amorphous glass includes $Y_2O_3$ such that a content of $Y_2O_3$ is 2.8 mol % to 20 mol % based on oxides with respect to a total amount of the supporting glass substrate.

19. The supporting glass substrate of claim 5, wherein the amorphous glass includes at least one selected from the group consisting of $B_2O_3$, $P_2O_5$, $Ga_2O_3$, AlN, $Si_3N_4$, $ZrO_2$, $TiO_2$, $Li_2O$, and ZnO.

20. The supporting glass substrate of claim 5, wherein the amorphous glass includes $B_2O_3$ such that a content of $B_2O_3$ is 3 mol % to 10 mol % based on oxides with respect to a total amount of the supporting glass substrate.

* * * * *